United States Patent
Chen et al.

(10) Patent No.: US 12,445,101 B2
(45) Date of Patent: Oct. 14, 2025

(54) AUTOMATIC LEVEL CONTROL CIRCUIT, SIGNAL SOURCE, METHOD FOR CONTROLLING SIGNAL SOURCE OUTPUT POWER, AND STORAGE MEDIUM

(71) Applicant: ZTE CORPORATION, Guangdong (CN)

(72) Inventors: Song Chen, Guangdong (CN); Jie Lin, Guangdong (CN); Hao Chen, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 449 days.

(21) Appl. No.: 17/919,784

(22) PCT Filed: Apr. 21, 2021

(86) PCT No.: PCT/CN2021/088632
§ 371 (c)(1),
(2) Date: Oct. 19, 2022

(87) PCT Pub. No.: WO2021/213426
PCT Pub. Date: Oct. 28, 2021

(65) Prior Publication Data
US 2023/0155560 A1 May 18, 2023

(30) Foreign Application Priority Data
Apr. 21, 2020 (CN) .......................... 202010317564.3

(51) Int. Cl.
*H03G 3/30* (2006.01)
(52) U.S. Cl.
CPC ..... *H03G 3/3036* (2013.01); *H03G 2201/103* (2013.01); *H03G 2201/307* (2013.01)

(58) Field of Classification Search
CPC .......... H03G 3/3036; H03G 2201/103; H03G 2201/307; H03G 1/0088; H03G 2201/106;
(Continued)

(56) References Cited

U.S. PATENT DOCUMENTS 5,493,252 A * 2/1996 Takai .................... H03F 1/3235
330/151
5,732,334 A 3/1998 Miyake
(Continued)

FOREIGN PATENT DOCUMENTS

| CN | 204177965 U | 2/2015 |
|---|---|---|
| CN | 104393857 A | 3/2015 |

(Continued)

OTHER PUBLICATIONS

European Patent Office, extended European Search Report dated Apr. 26, 2024, for corresponding EP application No. 21792584.1.
WIPO, International Search Report issued on Jul. 8, 2021.

*Primary Examiner* — Khanh V Nguyen
(74) *Attorney, Agent, or Firm* — Li & Cai Intellectual Property (USA) Office

(57) ABSTRACT

Provided are automatic level control (ALC) circuit, signal source, method for controlling signal source output power, and storage medium. The ALC circuit includes: at least two stages of ALC loops, each ALC loop including an amplifier, a coupler, a power detector, and an attenuation control module connected sequentially. An output end of an adjustable attenuator is connected to an input node of first stage of ALC loop; an output node of each stage of ALC loop, other than last stage of ALC loop, is connected to a normally on end of a two-way single-on switch, a first gating end of the two-way single-on switch is connected to an input node of a next stage of ALC loop, and the output node of the last
(Continued)

stage of ALC loop and a second gating end of each two-way single-on switch are connected to an output end of the ALC circuit.

18 Claims, 6 Drawing Sheets

(58) Field of Classification Search
CPC . H03G 3/30; H03G 3/20; H03G 3/001; H03F 2200/211; H03F 1/12
USPC .................................................. 330/149, 284
See application file for complete search history.

(56) References Cited

U.S. PATENT DOCUMENTS

| | | | | |
|---|---|---|---|---|
| 5,877,653 A | * | 3/1999 | Kim ...................... | H03F 1/3252 |
| | | | | 330/149 |
| 6,133,791 A | * | 10/2000 | Horiguchi ............. | H03F 1/3229 |
| | | | | 330/149 |
| 6,208,204 B1 | * | 3/2001 | Suzuki .................. | H03F 1/3229 |
| | | | | 330/149 |
| 2015/0365579 A1 | | 12/2015 | Moholt | |

FOREIGN PATENT DOCUMENTS

| | | |
|---|---|---|
| CN | 106885929 A | 6/2017 |
| CN | 208174646 U | 11/2018 |
| JP | 2003318672 A | 11/2003 |

* cited by examiner

AUTOMATIC LEVEL CONTROL CIRCUIT, SIGNAL SOURCE, METHOD FOR CONTROLLING SIGNAL SOURCE OUTPUT POWER, AND STORAGE MEDIUM

TECHNICAL FIELD

The present disclosure relates to, but is not limited to, the field of mobile communication.

BACKGROUND

With rapid development in the field of mobile communication, higher and higher requirements are put on performance of the signal source, and the signal source is desired to have small power fluctuations during output in a large dynamic range. Therefore, an automatic level control (ALC) circuit is typically used on a radio frequency link of the signal source.

SUMMARY

An embodiment of the present disclosure provides an ALC circuit, including: at least two stages of ALC loops, each ALC loop including an amplifier, a coupler, a power detector, and an attenuation control module configured to determine a control voltage of an adjustable attenuator connected sequentially, where an input end of the amplifier is an input node of the ALC loop, an output end of the coupler is an output node of the ALC loop, and an output end of the attenuation control module is connected to a control end of the adjustable attenuator; an input end of the adjustable attenuator is an input end of the ALC circuit, and an output end of the adjustable attenuator is connected to an input node of a first stage of ALC loop; and the output node of each stage of ALC loop, other than a last stage of ALC loop, is connected to a normally on end of a two-way single-on switch, a first gating end of the two-way single-on switch is connected to an input node of a next stage of ALC loop, and the output node of the last stage of ALC loop and a second gating end of each two-way single-on switch are connected to an output end of the ALC circuit.

An embodiment of the present disclosure provides a signal source, including: the ALC circuit according to any embodiment of the present disclosure.

An embodiment of the present disclosure provides a method for controlling a signal source output power, including: acquiring a target power value input by a user; matching the target power value with at least two preset power intervals; determining, according to a preset power interval matched with the target power value, an ALC loop corresponding to the target power value based on a correspondence relationship between the preset power interval and the ALC loop in an automatic level control (ALC) circuit; gating the ALC loop corresponding to the target power value through an attenuation control module and a two-way single-on switch; and controlling, by the attenuation control module based on the target power value, an output power of the ALC circuit.

An embodiment of the present disclosure further provides a storage medium having a computer program stored thereon which, when executed by a processor, causes the processor to perform the method for controlling a signal source output power according to any embodiment of the present disclosure.

DETAIL DESCRIPTION OF EMBODIMENTS

For clarity and better understanding of the objects, technical solution and advantages of the present disclosure, embodiments of the present disclosure will be described in detail below in conjunction with the accompanying drawings. It should be noted that the embodiments of the present disclosure and features therein may be combined with each other in any manner as long as they are not contradictory.

An adjustable range of a signal source output power depends on an attenuation range of an adjustable attenuator in an ALC circuit. However, the attenuation linear range of the adjustable attenuator is typically not very large, which may cause fluctuations of power when the signal source is used for sending a high power signal, thereby affecting the test.

To this end, the present disclosure provides, among others, an ALC circuit, a signal source, a method for controlling a signal source output power, and a storage medium which substantially avoid one or more of the problems due to limitations and restrictions in the existing art. According to the ALC circuit, the signal source, the method for controlling a signal source output power, and the storage medium provided in the embodiments of the present disclosure, the ALC circuit is formed by at least two stages of ALC loops, so as to solve the problems of small coverage range and fluctuations of the signal source output power, and achieve power stability of the signal source when used in a scenario of large dynamic range power output.

Figure 1:
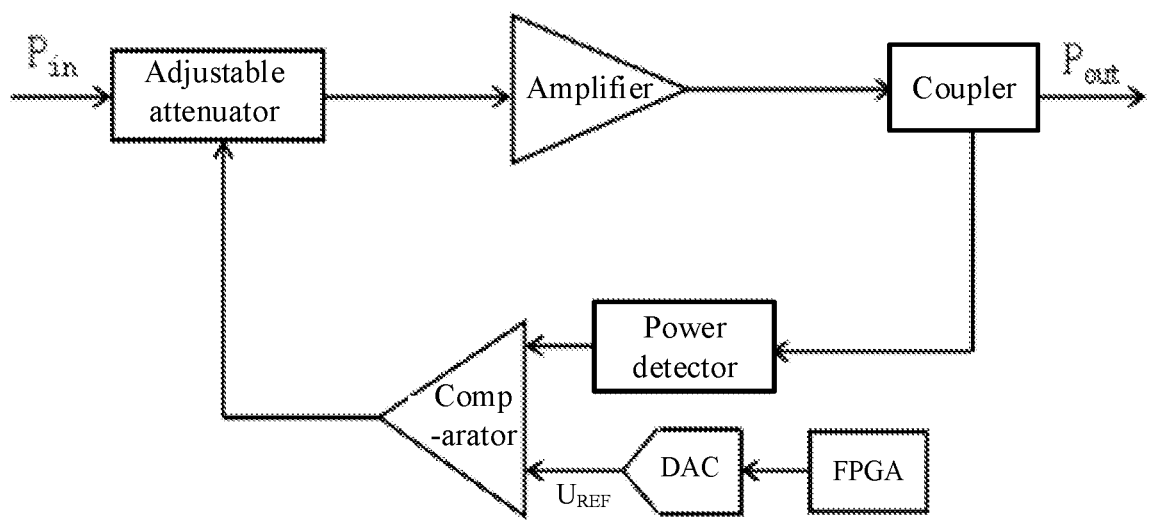
FIG. 1 is a schematic structural diagram of an ALC circuit in the existing art.

FIG. 1 shows a closed-loop ALC circuit scheme commonly used for a signal source in the existing art. The ALC circuit structure shown in FIG. 1 has merely one ALC loop, and hardware of the closed-loop ALC circuit includes an adjustable attenuator and an amplifier in a primary channel, a power detector and an integral comparator in a negative feedback channel, and a field programmable gate array (FPGA) and a digital-to-analog converter (DAC) for generating a control voltage. The closed-loop ALC system collects some output signals with a coupler, performs power detection and integral comparison with a reference voltage, to generate the control signal which controls the adjustable attenuator of a previous stage to change the attenuation value and then the power capable of being input into the ALC circuit, so as to maintain stability of the output power. In addition, the reference voltage in the feedback channel can also be changed to adjust a magnitude of the output power. As can be seen, the closed-loop ALC system can not only stabilize the output power, but also keep the output power adjustable within a certain range. Since merely one stage of ALC loop is adopted in the ALC circuit shown in FIG. 1, the linear adjusting range of the adjustable attenuator is limited. As a result, a signal source adopting such an ALC circuit can maintain stability of the output power in merely some ranges, and when the output power exceeds the adjustable range of the adjustable attenuator, no power stabilizing effect exists, and power fluctuations will occur.

An embodiment of the present disclosure provides an ALC circuit, including: at least two stages of ALC loops, each ALC loop including an amplifier, a coupler, a power detector, and an attenuation control module sequentially connected, where the attenuation control module is configured to determine a control voltage of an adjustable attenuator. An input end of the amplifier is an input node of the ALC loop, an output end of the coupler is an output node of the ALC loop, and an output end of the attenuation control module is connected to a control end of the adjustable attenuator. An input end of the adjustable attenuator is an input end of the ALC circuit, and an output end of the adjustable attenuator is connected to an input node of a first stage of ALC loop. The output node of each stage of ALC loop, other than a last stage of ALC loop, is connected to a normally on end of a two-way single-on switch, a first gating end of the two-way single-on switch is connected to an input node of a next stage of ALC loop, and the output node of the last stage of ALC loop and a second gating end of each two-way single-on switch are connected to an output end of the ALC circuit.

Figure 2:
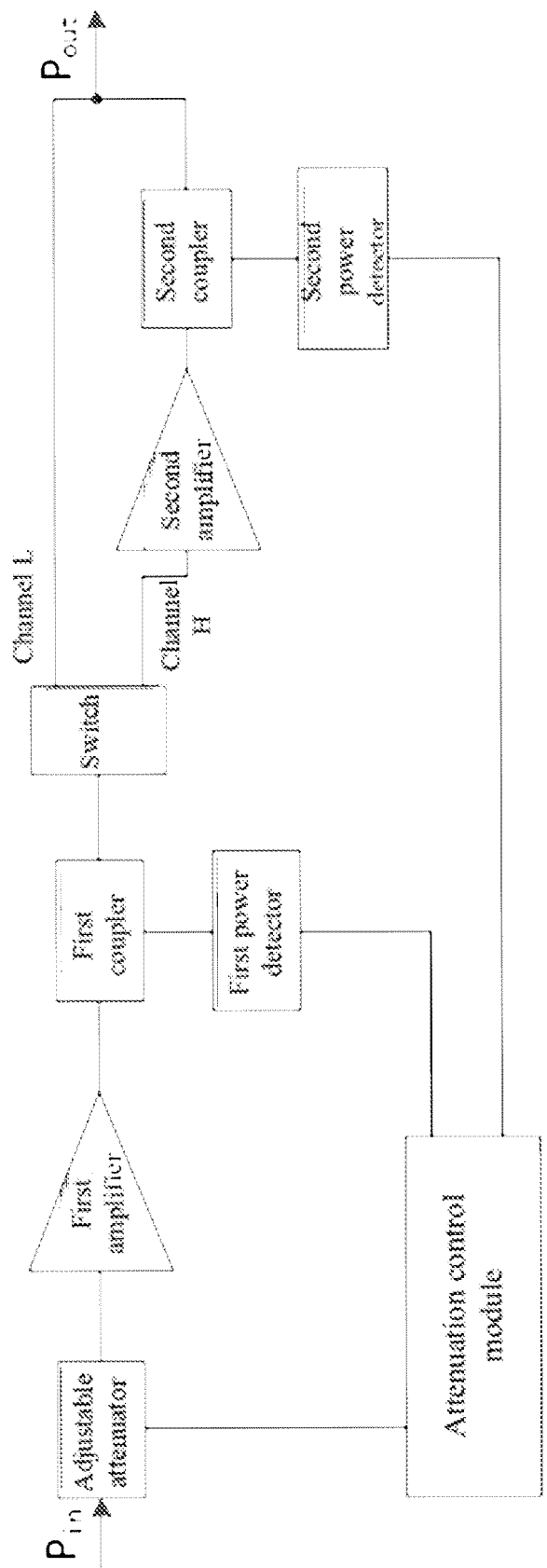
FIG. 2 is a schematic structural diagram of an ALC circuit according to an embodiment of the present disclosure.

With the ALC circuit including at least two stages of ALC loops, the ALC output power can cover a wider range. FIG. 2 shows a structure of an ALC circuit, taking an ALC circuit including two stages of ALC loops as an example. A first stage of ALC loop includes a first amplifier, a first coupler, and a first power detector, and a second stage of ALC loop includes a second amplifier, a second coupler, and a second power detector. An output end of the first power detector and an output end of the second power detector are respectively connected to the corresponding input ends of the attenuation control module which serves as a common part of the two stages of ALC loops. The first stage of ALC loop and the second stage of ALC loop correspond to different preset power intervals. The first stage of ALC loop corresponds to a low power interval, the second stage of ALC loop corresponds to a high power interval, and a preset power value serves as a dividing point of the low power interval and the high power interval, where values less than or equal to the preset power value belong to the low power interval, and values greater than the preset power value belong to the high power interval. After a target power value is compared with the preset power value, the preset power interval to which the target power value belongs can be determined, so that a corresponding ALC loop is selected for automatic level control, and the attenuation control module controls the adjustable attenuator according to a voltage signal fed back from the power detector in the selected ALC loop.

In an implementation, the attenuation control module includes: a digital signal processing chip and a digital-to-analog converter (DAC). the digital signal processing chip has an on-chip analog-to-digital conversion function, and may be, for example, an FPGA; the output end of the power detector in each stage of ALC loop is connected to the corresponding analog-to-digital conversion input end on the digital signal processing chip; the output end of the digital signal processing chip is connected to the input end of the DAC; and the output end of the DAC is connected to the control end of the adjustable attenuator.

Figure 3:
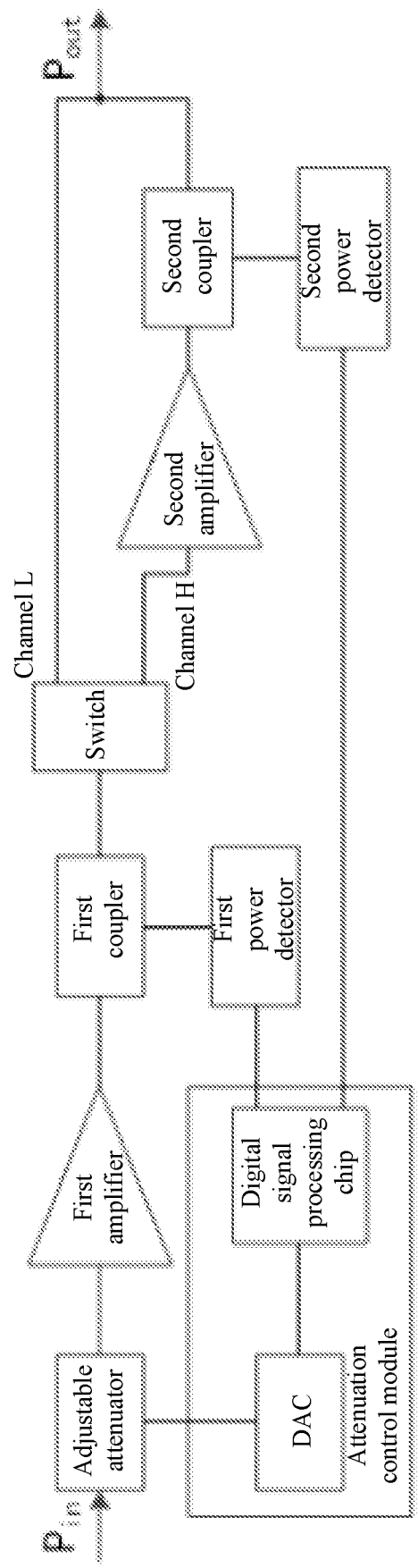
FIG. 3 is a schematic structural diagram of an ALC circuit according to an embodiment of the present disclosure.

FIG. 3 shows a structure of an ALC circuit, taking an ALC circuit including two stages of ALC loops as an example. Merely one adjustable attenuator is provided in the ALC circuit, and following the adjustable attenuator, a first amplifier is provided to improve an output power upper limit of a link. An output signal from the first amplifier enters a first power detector in a negative feedback channel after passing through a first coupler, so that a power radio frequency signal is converted into a voltage. The feedback voltage is compared with a reference voltage of an attenuation control module, and finally, a control voltage output from the attenuation control module is fed back to the adjustable attenuator to adjust an attenuation value of the adjustable attenuator. When the first stage of ALC loop is selected for automatic level control according to a target power value selected by a user, a switch selects to turn on a first gating end, i.e., selects a channel L, to output the power radio frequency signal at an output end of the first coupler to the outside. The first power detector outputs the feedback voltage to an analog-to-digital conversion input end of a digital signal processing chip. The digital signal processing chip has an on-chip analog-to-digital conversion function, and the analog-to-digital conversion input end of the digital signal processing chip is a pin thereof capable of performing analog-to-digital conversion. In this implementation, the ALC circuit includes two stages of ALC loops, so the feedback voltage of each stage of ALC loop is input into the digital signal processing chip through the corresponding pin. The digital signal processing chip compares the received feedback voltage of the first stage of ALC loop with a preset reference voltage, and outputs a digital control signal for controlling the adjustable attenuator to the DAC, where the preset reference voltage is determined according to the target power value, and then, the DAC converts the digital control signal into an analog control signal to control the attenuation value of the adjustable attenuator. When the second stage of ALC loop is selected for automatic level control according to the target power value selected by the user, the switch selects to turn on a second gating end, i.e., selects a channel H, to output the power radio frequency signal at the output end of the first coupler to a second amplifier of the second stage of ALC loop. The second power detector outputs the feedback voltage to a corresponding analog-to-digital conversion input end on the digital signal processing chip. In this case, the digital signal processing chip processes merely the feedback voltage of the second stage of ALC loop, compares the received feedback voltage of the second stage of ALC loop with the preset reference voltage, and outputs a digital control signal for controlling the adjustable attenuator to the DAC, and then, the DAC converts the digital control signal into an analog control signal to control the attenuation value of the adjustable attenuator.

In an exemplary implementation, when the power to be output is relatively low ($P_{out} \leq P0$, where P0 is the preset power value), the control system will control the switch to select the channel L, and when the input power $P_{in}$ is increased, an instantaneous output power of the adjustable attenuator is increased, and the power after passing through the first amplifier, the power coupled and output by the first coupler, the power coupled to the feedback path of the first stage of ALC loop, as well as the output voltage after passing through the first power detector are also increased, while the preset reference voltage in the digital signal processing chip remains unchanged, which results in a reduced voltage output from the digital signal processing chip, and thus a reduced control voltage output from the DAC. Therefore, the attenuation value of the adjustable attenuator is increased, so that the output power after passing through the adjustable attenuator is reduced, and thus the output $P_{out}$ after passing the channel L remains unchanged. When $P_{in}$ remains unchanged, the instantaneous output voltage of the first power detector remains unchanged, and when the preset reference voltage of the digital signal processing chip is increased, the output control voltage and the control voltage of the DAC are increased, leading to a reduced attenuation value of the adjustable attenuator. Therefore, the $P_{out}$ after passing the channel L is increased, and the reference voltage has a linear proportional relation with $P_{out}$, so that $P_{out}$ is stable and adjustable within a certain range.

In an implementation, the attenuation control module includes: at least two comparators, at least two reference voltage units, and a multi-way single-on switch. A number of the comparators, a number of the reference voltage units, and a number of gating ends of the multi-way single-on switch are each equal to a number of the ALC loops; the output end of the power detector in each stage of ALC loop is connected to a first input end of a corresponding comparator; a second input end of the comparator is connected to a reference voltage output end of a corresponding reference voltage unit; a gating end of the multi-way single-on switch is connected to an output end of the corresponding comparator; and a normally on end of the multi-way single-on switch is connected to the control end of the adjustable attenuator.

In an embodiment, the reference voltage unit includes: a DAC and a digital signal processing chip; an input end of the DAC is connected to an output pin of the corresponding digital signal processing chip; and an output end of the DAC is used as an output end of the reference voltage unit.

The digital signal processing chip provides digital reference voltages of corresponding voltage values for DACs in different ALC loops, and then, the DAC in each stage of ALC loop outputs a corresponding analog reference voltage. Each comparator in the ALC loop outputs, according to the feedback voltage output from the power detector and the analog reference voltage, a corresponding control signal to the adjustable attenuator to control the attenuation value of the adjustable attenuator, thereby implementing control of the output power of the ALC circuit.

Figure 4:
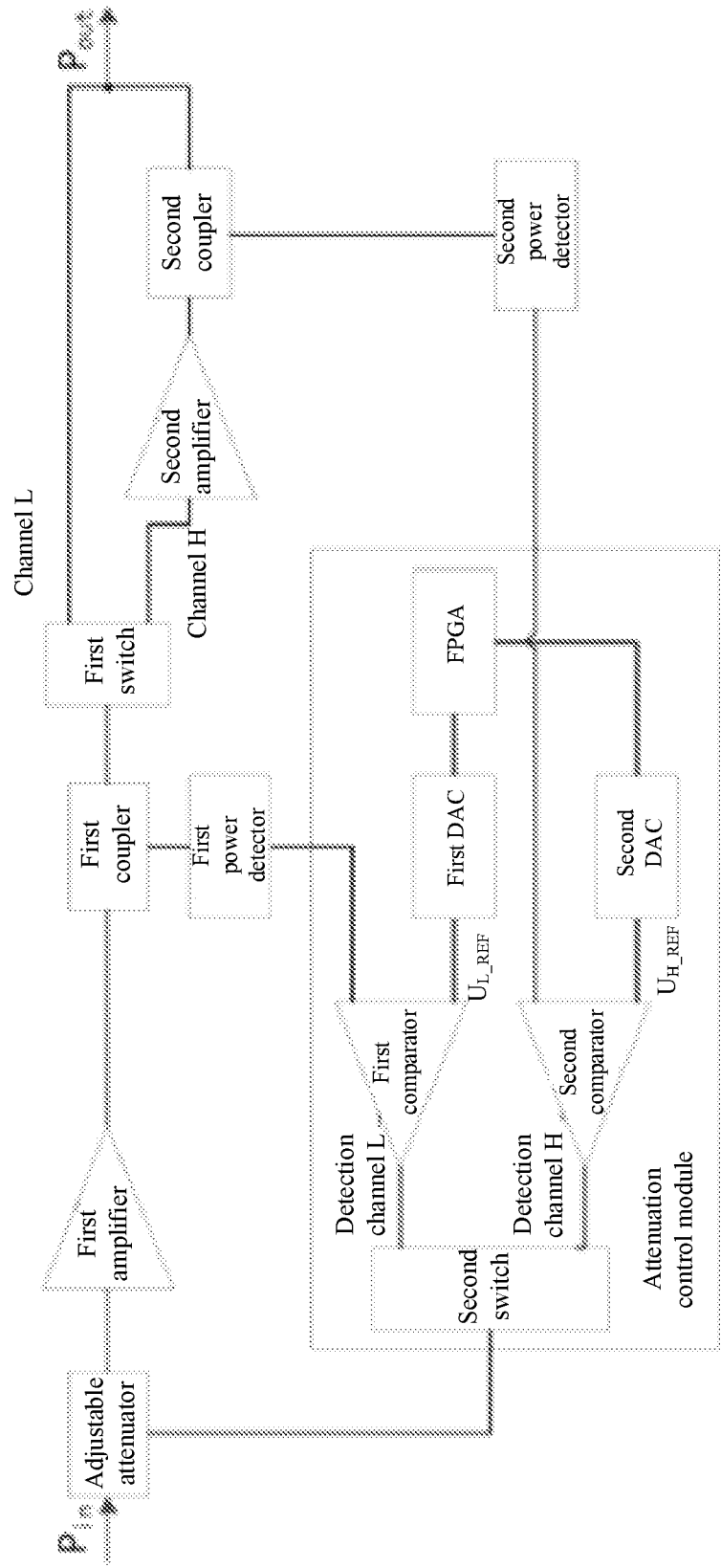
FIG. 4 is a schematic structural diagram of an ALC circuit according to an embodiment of the present disclosure.

FIG. 4 shows a structure of an ALC circuit, taking an ALC circuit including two stages of ALC loops as an example. When the power to be output is relatively low ($P_{out} \leq P0$, where P0 is the preset power value), the control system controls a first switch to select the channel L, and accordingly, controls a second switch to select the detection channel L, too. When the input power $P_{in}$ is increased, an instantaneous output power of the adjustable attenuator is increased, and the power after passing through the first amplifier, the power coupled and output by the first coupler, the power coupled to the feedback path of the first stage of ALC loop, as well as the output voltage after passing through the first power detector are also increased. In this case, the reference voltage $U_{L\_REF}$ output from a first DAC remains unchanged, while the voltage output from the first comparator is reduced. Therefore, the attenuation value of the adjustable attenuator is increased, so that the output power after passing through the adjustable attenuator is reduced, and thus the output $P_{out}$ after passing the channel L remains unchanged. When $P_{in}$ remains unchanged, the instantaneous output voltage of the first power detector remains unchanged, and the reference voltage $U_{L\_REF}$ output from the first DAC is increased, the control voltage output from the first comparator is increased, leading to a reduced attenuation value of the adjustable attenuator. Therefore, the $P_{out}$ after passing the channel L is increased, and $U_{L\_REF}$ has a linear proportional relation with $P_{out}$, so that $P_{out}$ is stable and adjustable within a certain range.

When the power to be output is relatively high ($P_{out} > P0$), the control system controls the first switch to select the channel H, and accordingly, controls the second switch to select the detection channel H, too. When the input power $P_{in}$ is increased, an instantaneous output power of the adjustable attenuator is increased, and the output power after passing through first amplifier is also increased. After the first coupler, the path H is gated. The output power of the second amplifier on the path H, the power coupled and output by the second coupler, the power coupled to the feedback path of the second stage of ALC loop, as well as the output voltage after passing through the second power detector are also increased. In this case, the reference voltage $U_{H\_REF}$ output from the second DAC remains unchanged, while the voltage output from the second comparator is reduced. Therefore, the attenuation value of the adjustable attenuator is increased, so that the output power after passing through the adjustable attenuator is reduced, and thus the output $P_{out}$ after passing the channel H remains unchanged. When $P_{in}$ remains unchanged, the instantaneous output voltage of the second power detector remains unchanged, and the Reference voltage $U_{H\_REF}$ output from the second DAC is increased, the control voltage output from the second comparator is increased, leading to a reduced attenuation value of the adjustable attenuator. Therefore, the $P_{out}$ after passing the channel H is increased, and $U_{H\_REF}$ has a linear proportional relation with $P_{out}$, so that $P_{out}$ is stable and adjustable within a certain range.

In an implementation, the ALC circuit further includes: a direct current amplifier between the normally on end of the multi-way single-on switch and the control end of the adjustable attenuator.

Figure 5:
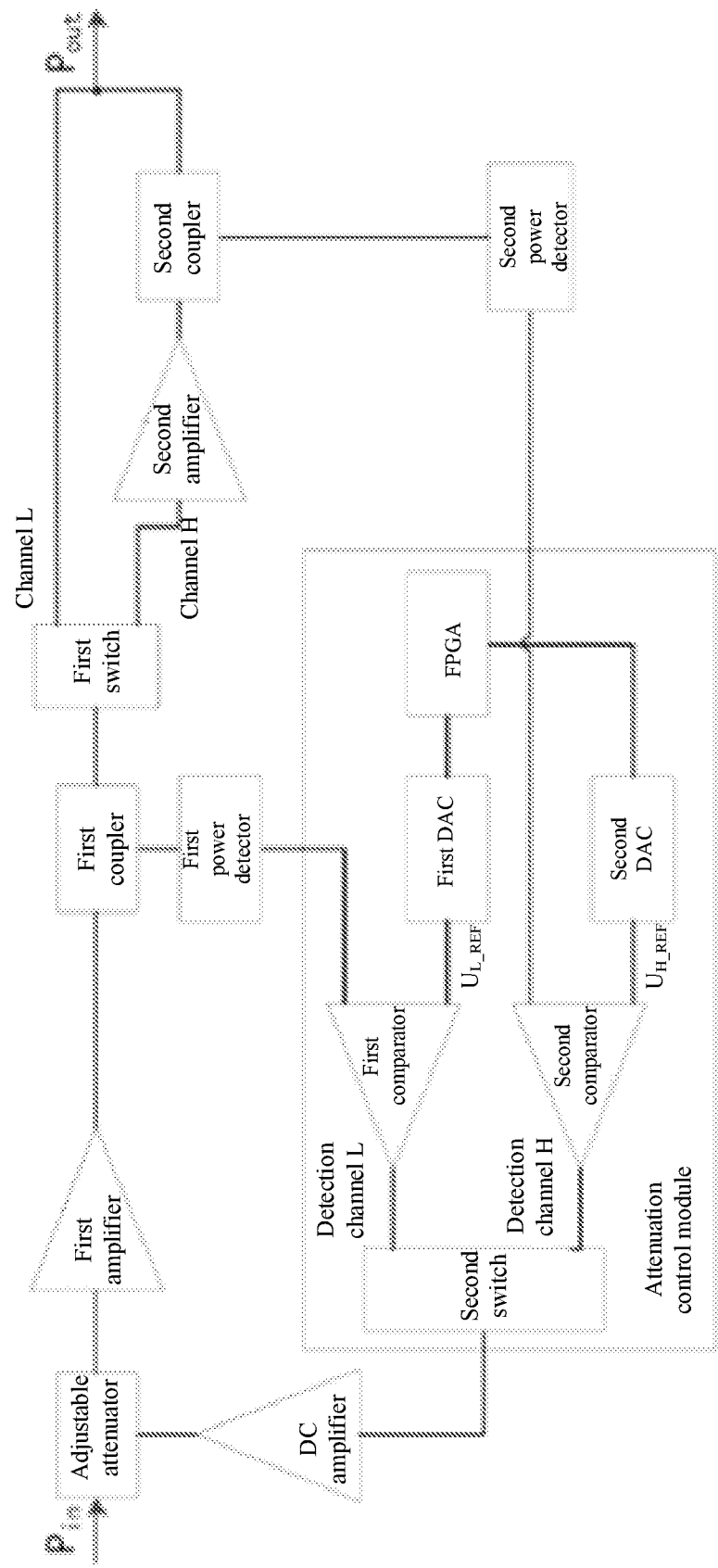
FIG. 5 is a schematic structural diagram of an ALC circuit according to an embodiment of the present disclosure.

A direct current amplifier may be added after the second switch to amplify the control voltage output from the comparator, and provide the amplified control voltage to the adjustable attenuator as a control signal, as shown in FIG. 5. When the power to be output is relatively low ($P_{out} \leq P0$, where P0 is the preset power value), the control system controls a first switch to select the channel L, and accordingly, controls a second switch to select the detection channel L, too. When the input power $P_{in}$ is increased, an instantaneous output power of the adjustable attenuator is increased, and the power after passing through the first amplifier, the power coupled and output by the first coupler, the power coupled to the feedback path of the first stage of ALC loop, as well as the output voltage after passing through the first power detector are also increased. In this case, the reference voltage $U_{L\_REF}$ output from a first DAC remains unchanged, while the voltage output from the first comparator is reduced. Therefore, the attenuation value of the adjustable attenuator is increased, so that the output power after passing through the adjustable attenuator is reduced, and thus the output $P_{out}$ after passing the channel L remains unchanged. When $P_{in}$ remains unchanged, the instantaneous output voltage of the first power detector remains unchanged, and the reference voltage $U_{L\_REF}$ output from the first DAC is increased, the control voltage output from the first comparator is increased, the attenuation value of the adjustable attenuator is controlled to be reduced by amplifying the control voltage according to a certain proportion through the direct current amplifier after passing through the second switch. Therefore, the $P_{out}$ after passing the channel L is increased, and $U_{L\_REF}$ has a linear proportional relation with $P_{out}$, so that $P_{out}$ is stable and adjustable within a certain range.

When the power to be output is relatively high ($P_{out} > P0$), the control system controls the first switch to select the channel H, and accordingly, controls the second switch to select the detection channel H, too. When the input power $P_{in}$ is increased, an instantaneous output power of the adjustable attenuator is increased, and the output power after passing through first amplifier is also increased. After the first coupler, the path H is gated. The output power of the second amplifier on the path H, the power coupled and output by the second coupler, the power coupled to the feedback path of the second stage of ALC loop, as well as the output voltage after passing through the second power detector are also increased. In this case, the reference voltage $U_{H\_REF}$ output from the second DAC remains unchanged, while the voltage output from the second comparator is reduced. Therefore, the attenuation value of the adjustable attenuator is increased, so that the output power after passing through the adjustable attenuator is reduced, and thus the output $P_{out}$ after passing the channel H remains unchanged. When $P_{in}$ remains unchanged, the instantaneous output voltage of the second power detector remains unchanged, and the reference voltage $U_{H\_REF}$ output from the second DAC is increased, the control voltage output from the second comparator is increased, the attenuation value of the adjustable attenuator is controlled to be reduced by amplifying the control voltage according to a certain proportion through the direct current amplifier after passing through the second switch. Therefore, the $P_{out}$ after passing the channel H is increased, and $U_{H\_REF}$ has a linear proportional relation with $P_{out}$, so that $P_{out}$ is stable and adjustable within a certain range.

An embodiment of the present disclosure provides a signal source, including the ALC circuit according to any embodiment of the present disclosure.

Figure 6:
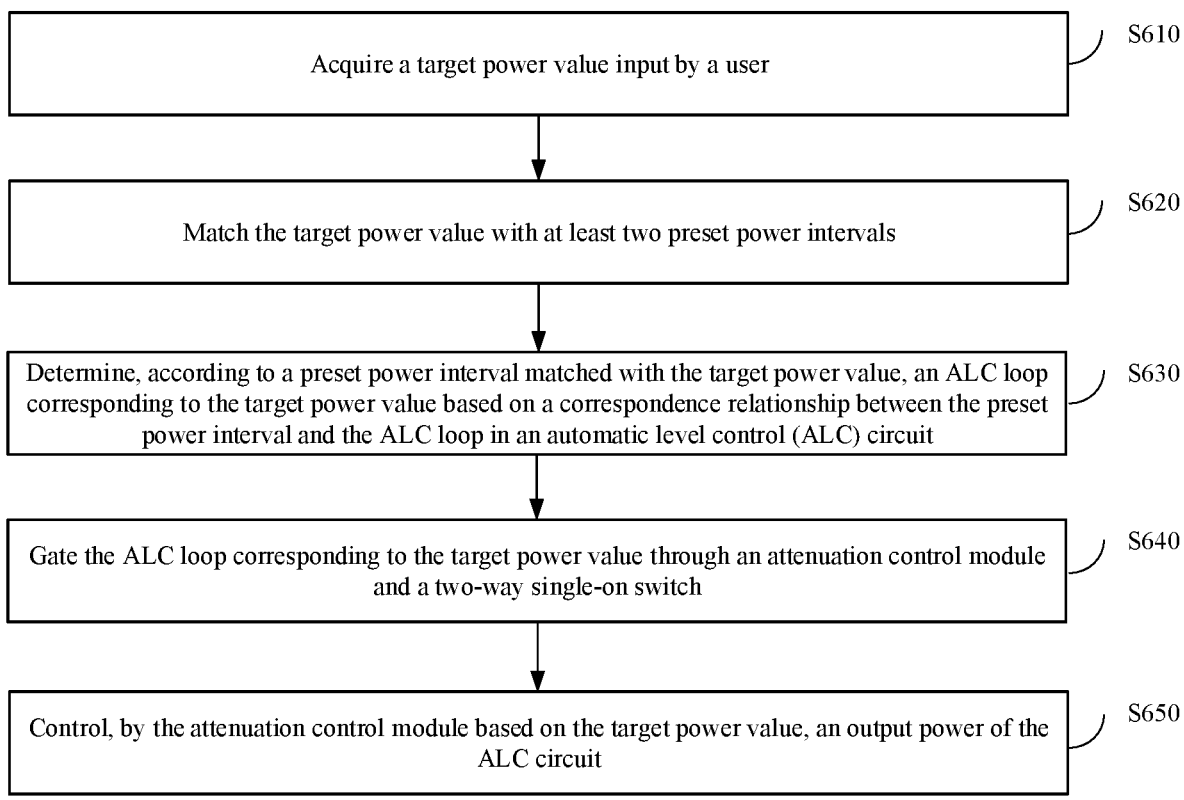
FIG. 6 is a flowchart of a method for controlling a signal source output power according to an embodiment of the present disclosure.

FIG. 6 shows a flowchart of a method for controlling a signal source output power according to an embodiment of the present disclosure. The method may include operations S610 to S650.

At operation S610, acquiring a target power value input by a user.

At operation S620, matching the target power value with at least two preset power intervals.

At operation S630, determining, according to a preset power interval matched with the target power value, an ALC loop corresponding to the target power value based on a correspondence relationship between the preset power interval and the ALC loop in an automatic level control (ALC) circuit.

At operation S640, gating the ALC loop corresponding to the target power value through an attenuation control module and a two-way single-on switch.

At operation S650, controlling, by the attenuation control module based on the target power value, an output power of the ALC circuit.

For an ALC circuit including two stages of ALC loops, there are also two preset power intervals. A right endpoint of a preset power interval corresponding to a first stage of ALC loop is a preset power value P0, and a left endpoint of a preset power interval corresponding to a second stage of ALC loop is the preset power value P0. It will be appreciated that the preset power value P0 belongs to one of the preset power intervals, and the preset power value P0 may be configured in the preset power interval corresponding to the first stage of ALC loop. In other words, values less than or equal to the preset power value belong to the preset power interval corresponding to the first stage of ALC loop, i.e., a low power interval; and values greater than the preset power value belong to the preset power interval corresponding to the second stage of ALC loop, i.e., a high power interval. Then, when the signal source is powered on and initialized, if a target power value input by a user, that is, a power value expected to be output by the user, is acquired, the target power value is matched with at least two preset power intervals, that is, the preset power interval to which the target power value belongs is determined. After determining the preset power interval matched with the target power value, the ALC loop to be gated can be determined. The ALC loop corresponding to the target power value is gated through an attenuation control module and a two-way single-on switch. Taking the ALC circuit shown in FIG. 2 as an example, the switch is desired to select the channel L or H, and accordingly, the attenuation control module determines a control signal according to a feedback voltage of the gated ALC loop, to control the attenuation value of the adjustable attenuator. It will be appreciated that if more than two ALC loops are configured in the ALC circuit, an output power range supported by the signal source will be divided into preset power intervals of a same number as, and in one-to-one correspondence with, the ALC loops.

In an implementation, after controlling, by the attenuation control module based on the target power value, the output power of the ALC circuit, the method for controlling a signal source output power further includes: acquiring an adjusting power value input by a user; matching the adjusting power value with at least two preset power intervals; and if a preset power interval matched with the adjusting power value is still the preset power interval matched with the target power value: correspondingly adjusting, by the attenuation control module based on the adjusting power value, the output power of the ALC circuit.

If the user is to adjust the output power of the ALC circuit, an adjusting power value, which is obviously different from the original target power value, is input. In this case, the preset power interval to which the adjusting power value belongs is desired to be determined. If the preset power interval matched with the adjusting power value is still the preset power interval matched with the target power value, it indicates that the gated ALC loop is not desired to be changed, and the output power of the ALC circuit can be correspondingly adjusted by simply determining the control voltage for controlling the adjustable attenuator by the attenuation control module based on the adjusting power value.

In an embodiment, after matching the adjusting power value with at least two preset power intervals, the method further includes: if a preset power interval matched with the adjusting power value is not the preset power interval matched with the target power value, determining, according to the preset power interval matched with the adjusting power value, an ALC loop corresponding to the adjusting power value based on a correspondence relationship between the preset power interval and the ALC loop; gating the ALC loop corresponding to the adjusting power value through the attenuation control module and the two-way single-on switch; and correspondingly adjusting, by the attenuation control module based on the adjusting power value, the output power of the ALC circuit.

If the preset power interval matched with the adjusting power value is not the preset power interval matched with the target power value, it indicates that the gated ALC loop is desired to be changed, and then, after the corresponding ALC loop is gated, the output power of the ALC circuit is correspondingly adjusted by determining the control voltage for controlling the adjustable attenuator by the attenuation control module based on the adjusting power value.

An embodiment of the present disclosure further provides a storage medium having a computer program stored thereon which, when executed by a processor, causes the processor to perform the method for controlling a signal source output power according to any embodiment of the present disclosure. The storage medium may be a non-transitory storage medium, including but not limited to, a read only memory (ROM), a random-access memory (RAM), an optical storage device or system (a digital versatile disc (DVD) or a compact disc (CD)), or the like.

The above are merely exemplary embodiments of the present disclosure and not intended to limit the scope of the present disclosure.

It will be clear to those skilled in the art that the term "user terminal" covers any suitable type of wireless user equipment, such as mobile phones, portable data processing devices, portable web browsers or vehicle-mounted mobile stations.

In general, the various embodiments of the present disclosure may be implemented in hardware or special purpose circuits, software, logic or any combination thereof. For example, some aspects may be implemented in hardware, while other aspects may be implemented in firmware or software which may be executed by a controller, a microprocessor or any other computing device, although the present disclosure is not limited thereto.

Embodiments of the present disclosure may be implemented by a data processor of the signal source executing computer program instructions, for example, in a processor entity, or by hardware, or by a combination of software and hardware. The computer program instructions may be assembler instructions, instruction set architecture (ISA) instructions, machine instructions, machine-related instructions, micro codes, firmware instructions, state setting data, or source or object codes written in any combination of one or more programming languages.

The block diagrams of any logic flow in the figures of the present application may represent program operations, or may represent interconnected logic circuits, modules, and functions, or may represent a combination of program operations and logic circuits, modules, and functions. The computer program may be stored on a memory. The memory may be of any type suitable to the local technical environment and may be implemented in any suitable data storage technology, such as but not limited to, read only memories (ROMs), random access memories (RAMs), optical storage devices or systems (digital versatile discs (DVDs), compact discs (CDs)), etc. The computer-readable medium may include a non-transitory storage medium. The data processor may be of any type suitable to the local technical environment, such as but not limited to, general purpose computers, dedicated computers, microprocessors, digital signal processors (DSPs), application specific integrated circuits (ASICs), field programmable gate arrays (FGPAs), and processors based on multi-core processor architecture.

The foregoing has provided by way of exemplary and non-limiting examples a detailed description of exemplary embodiments of the present disclosure. Various modifications and adaptations to the foregoing embodiments may become apparent to those skilled in the art in view of the accompanying drawings and the appended claims, without departing from the scope of the present disclosure. Accordingly, the proper scope of the present disclosure is defined by the appended claims.

What is claimed is:

1. An automatic level control (ALC) circuit, comprising:
at least two stages of ALC loops, each stage of ALC loop comprising an amplifier, a coupler, a power detector, and an attenuation control circuit sequentially connected, the attenuation control circuit being configured to determine a control voltage of an adjustable attenuator, wherein in each stage of ALC loop, an input terminal of the amplifier in the stage of ALC loop is an input node of the stage of ALC loop, an output terminal of the coupler in the stage of ALC loop is an output node of the stage of the ALC loop, and an output terminal of the attenuation control circuit is connected to a control terminal of the adjustable attenuator;
an input terminal of the adjustable attenuator is an input terminal of the ALC circuit, and an output terminal of the adjustable attenuator is connected to the input node of a first stage of ALC loop; and
the ALC circuit further comprises a single-pole double-throw (SPDT) switch provided between adjacent stages of the at least two stages of ALC loops, wherein
the output node of a previous stage of ALC loop of the adjacent stages of the at least two stages of ALC loops is connected to an input terminal of the SPDT switch, a first output terminal of the SPDT switch is connected to the input node of a next stage of ALC loop of the adjacent stages of the at least two stages of ALC loops, and the output node of a last stage of ALC loop and a second output terminal of the SPDT switch are connected to an output terminal of the ALC circuit.

2. The ALC circuit according to claim 1, wherein the attenuation control circuit comprises: a digital signal processing chip and a digital-to-analog converter (DAC); wherein the digital signal processing chip has an on-chip analog-to-digital conversion function;
an output terminal of the power detector in each stage of ALC loop is connected to a corresponding analog-to-digital conversion input terminal on the digital signal processing chip;
an output terminal of the digital signal processing chip is connected to an input terminal of the DAC; and
an output terminal of the DAC is connected to the control terminal of the adjustable attenuator.

3. The ALC circuit according to claim 1, wherein the attenuation control circuit comprises:
at least two comparators, at least two reference voltage sub-circuits, and a multi-way single-on switch; wherein a number of the at least two comparators, a number of the at least two reference voltage sub-circuits, and a number of input terminals of the multi-way single-on switch are each equal to a number of the at least two stages of ALC loops;
an output terminal of the power detector in each stage of ALC loop is connected to a first input terminal of a corresponding comparator;
a second input terminal of the comparator is connected to a reference voltage output terminal of a corresponding reference voltage sub-circuit;
an input terminal of the multi-way single-on switch is connected to an output terminal of the corresponding comparator; and
an output terminal of the multi-way single-on switch is connected to the control terminal of the adjustable attenuator.

4. The ALC circuit according to claim 3, further comprising:
a direct current amplifier between the output terminal of the multi-way single-on switch and the control terminal of the adjustable attenuator.

5. The ALC circuit according to claim 3, wherein the reference voltage sub-circuit comprises:
a DAC and a digital signal processing chip;

an input terminal of the DAC is connected to a corresponding output pin of the digital signal processing chip; and an output terminal of the DAC is used as an output terminal of the reference voltage sub-circuit.

6. A signal source, comprising the ALC circuit according to claim 1.

7. A method for controlling a signal source output power, applied to the signal source of claim 6, comprising:

acquiring a target power value input by a user;

matching the target power value with at least two preset power intervals;

determining, according to a preset power interval matched with the target power value, an automatic level control (ALC) loop corresponding to the target power value based on a correspondence relationship between the preset power interval and the ALC loop in the ALC circuit;

gating the ALC loop corresponding to the target power value through the attenuation control circuit and the SPDT switch; and controlling, by the attenuation control circuit based on the target power value, an output power of the ALC circuit.

8. The method according to claim 7, wherein after controlling, by the attenuation control circuit based on the target power value, the output power of the ALC circuit, the method further comprises:

acquiring an adjusting power value input by a user;

matching the adjusting power value with at least two preset power intervals; and if a preset power interval matched with the adjusting power value is still the preset power interval matched with the target power value, then:

correspondingly adjusting, by the attenuation control circuit based on the adjusting power value, the output power of the ALC circuit.

9. The method according to claim 8, wherein after matching the adjusting power value with at least two preset power intervals, the method further comprises:

if the preset power interval matched with the adjusting power value is not the preset power interval matched with the target power value, then:

determining, according to the preset power interval matched with the adjusting power value, an ALC loop corresponding to the adjusting power value based on a correspondence relationship between the preset power interval and the ALC loop;

gating the ALC loop corresponding to the adjusting power value through the attenuation control circuit and the SPDT switch; and correspondingly adjusting, by the attenuation control circuit based on the adjusting power value, the output power of the ALC circuit.

10. A non-transitory storage medium having a computer program stored thereon which, when executed by a processor, causes the processor to perform the method according to claim 7.

11. The ALC circuit according to claim 4, wherein the reference voltage sub-circuit comprises:

a DAC and a digital signal processing chip;

an input terminal of the DAC is connected to a corresponding output pin of the digital signal processing chip; and an output terminal of the DAC is used as an output terminal of the reference voltage sub-circuit.

12. The signal source according to claim 6, wherein the attenuation control circuit comprises: a digital signal processing chip and a digital-to-analog converter (DAC); wherein the digital signal processing chip has an on-chip analog-to-digital conversion function;

an output terminal of the power detector in each stage of ALC loop is connected to a corresponding analog-to-digital conversion input terminal on the digital signal processing chip;

an output terminal of the digital signal processing chip is connected to an input terminal of the DAC; and an output terminal of the DAC is connected to the control terminal of the adjustable attenuator.

13. The signal source according to claim 6, wherein the attenuation control circuit comprises:

at least two comparators, at least two reference voltage sub-circuits, and a multi-way single-on switch; wherein a number of the at least two comparators, a number of the at least two reference voltage sub-circuits, and a number of input terminals of the multi-way single-on switch are each equal to a number of the at least two stages of ALC loops;

an output terminal of the power detector in each stage of ALC loop is connected to a first input terminal of a corresponding comparator;

a second input terminal of the comparator is connected to a reference voltage output terminal of a corresponding reference voltage sub-circuit;

an input terminal of the multi-way single-on switch is connected to an output terminal of the corresponding comparator; and an output terminal of the multi-way single-on switch is connected to the control terminal of the adjustable attenuator.

14. The signal source according to claim 13, further comprising:

a direct current amplifier between the output terminal of the multi-way single-on switch and the control terminal of the adjustable attenuator.

15. The signal source according to claim 13, wherein the reference voltage sub-circuit comprises:

a DAC and a digital signal processing chip;

an input terminal of the DAC is connected to a corresponding output pin of the digital signal processing chip; and an output terminal of the DAC is used as an output terminal of the reference voltage sub-circuit.

16. The signal source according to claim 14, wherein the reference voltage sub-circuit comprises:

a DAC and a digital signal processing chip;

an input terminal of the DAC is connected to a corresponding output pin of the digital signal processing chip; and an output terminal of the DAC is used as an output terminal of the reference voltage sub-circuit.

17. A non-transitory storage medium having a computer program stored thereon which, when executed by a processor, causes the processor to perform the method according to claim 8.

18. A non-transitory storage medium having a computer program stored thereon which, when executed by a processor, causes the processor to perform the method according to claim 9.

* * * * *